United States Patent [19]

Takeuchi

[11] Patent Number: 5,021,752

[45] Date of Patent: Jun. 4, 1991

[54] VOLTAGE CONTROLLED OSCILLATOR (VCO)

[75] Inventor: Kesatoshi Takeuchi, Suwa, Japan

[73] Assignee: Seiko Epson Corporation, Japan

[21] Appl. No.: 453,416

[22] Filed: Dec. 19, 1989

[30] Foreign Application Priority Data

Dec. 28, 1988 [JP] Japan .................. 63-331877

[51] Int. Cl.$^5$ ............................................. H03B 5/12
[52] U.S. Cl. ............................ 331/177 V; 331/117 R; 331/DIG. 3
[58] Field of Search .................. 331/36 C, 117 R, 167, 331/173, 177 V, DIG. 3

[56] References Cited

U.S. PATENT DOCUMENTS 4,533,881  8/1985  Monett .................. 331/117 R X
4,630,082  12/1986 Sakai ..................... 357/14
4,904,962  2/1990  Greene .................. 331/117 R

OTHER PUBLICATIONS

McCarthy, W. F., et al., "Emitter-Coupled Logic, controlled Oscillator" IBM Technical Disclosure Bulletin, vol. 18, No. 3, Aug. 1975, pp. 742-743.

Primary Examiner—David Mis
Attorney, Agent, or Firm—W. Douglas Carothers, Jr.

[57] ABSTRACT

A stable sampling clock signal is supplied from a VCO circuit which is able to operate in a synchronous manner with an external sync signal that does not posses good phase stability while also providing an enlarged range of variable frequency output. The VCO circuit of this invention comprises an oscillation output circuit, such as NAND or NOR circuit, having one input connected to receive an external sync signal and having its output for providing the desired oscillation or sampling clock frequency. A control voltage circuit is connected to the other input of the oscillation output circuit and to the output of the oscillation output circuit. A variable capacitance means, such as a variable capacitance diode, is included in the control voltage circuit and a control voltage is connected to the variable capacitance means to vary the capacitance of said control voltage means and stabilize the phase of said oscillation frequency output regardless of instantaneous variations in the phase of said external sync signal.

3 Claims, 2 Drawing Sheets

VOLTAGE CONTROLLED OSCILLATOR (VCO)

BACKGROUND OF THE INVENTION

This invention relates generally to a voltage controlled oscillator (VCO) circuit adapted for use in digital processing of video, audio or other such signals.

Reference is made to FIG. 1 which shows a block diagram of an arrangement for a conventional sampling clock generating phase locked loop (PLL) circuit which generates horizontal sampling clocks of a video signal. A horizontal sync signal 24 is provided at the input of the circuit as a reference signal for phase comparator (PC) 20. The frequency of the signal at the output 26 of voltage controlled oscillator (VCO) 22 is divided at N frequency divider 23 and placed on line 25 which is an input to phase comparator or detector 20. The horizontal sync signal 24 is compared with divided signal 25 in comparator 20 to produce a phase compensation value, which is then converted into a DC voltage component in low pass filter (LPF) 21. This DC component is feed back to VCO 22 to maintain its output in phase with reference signal 24 thereby producing an output frequency signal 26 from VCO 22 in phase with input frequency signal 24 having desired sampling clock characteristics. However, this PLL circuit does not effectively lock to the input reference signal particularly relative to applications where the horizontal sync signal contain inferior phase stability such as in laser disc apparatus, video tape apparatus, other such mechanical video devices, such as a laser disc player or a video tape deck, or the like and digital video processing circuits and the like. As a result, the sampling clock signal at output 24 is not continually maintained or stabilized in phase with input sync signal and there results an unsteadiness in the displayed picture commonly referred to as "jitter". In other words, technically, jitter is the fluctuation or change in the active sync pulse width so that the overall phase relation among a group of sync pulses, for example, is not uniform.

It is an object of the present invention to provide a VCO that is capable of an output of a sampling clock signal synchronized with a horizontal sync signal even if the stability in phase of the horizontal sync signal is not good and, further, enables the sampling clock frequency to be readily changed without narrowing the variable frequency range of the PLL circuit.

SUMMARY OF THE INVENTION

According to this invention, a stable sampling clock signal is supplied from a VCO circuit which is able to operate in a synchronous manner with an external sync signal that does not posses good phase stability while also providing an enlarged range of variable frequency output.

The VCO circuit of this invention comprises an oscillation output circuit, such as a NAND or NOR circuit, a coil, capacitors and a variable capacitance diode (VCD) arranged so that the oscillation frequency can be controlled as desired by varying the control voltage applied to the VCD during the rise time of the horizontal sync signal input to the VCO circuit. In particular, the VCO circuit of this invention comprises a NAND or NOR circuit having one input connected to receive an external sync signal and having its output for providing the desired oscillation or sampling clock frequency. A control voltage circuit is connected to the other input of the oscillation output circuit and to the output of the oscillation output circuit. A variable capacitance means, such as a variable capacitance diode, is included in the control voltage circuit and a control voltage is connected to the variable capacitance means to vary the capacitance of said control voltage means and stabilize the phase of said oscillation frequency output regardless of instantaneous variations in the phase of said external sync signal.

Accordingly, undesired variations in the oscillation frequency or sampling clock frequency due to, characteristics, for example, in various digital video processing circuits can be readily compensated for by proper variation of the control voltage input to the VCO circuit. Further, the improved stable VCO circuit comprising this invention, is significantly lower in cost and provides for substantially full reduction, if not elimination of, video jitter below the level of annoyance compared to conventional PLL circuits now used in such processing circuits whereby the improvements offered by this invention may be considered indispensable to modern digital video processing technology, now in the dawn of full prominance. Further, it is also possible to tune the VCO circuit to any desired sampling clock frequency simply by varying the input control voltage to the VCO circuit.

Other objects and attainments together with a fuller understanding of the invention will become apparent and appreciated by referring to the following description and claims taken in conjunction with the accompanying drawings.

DESCRIPTION OF THE PREFERRED EMBODIMENTS

Figure 1:
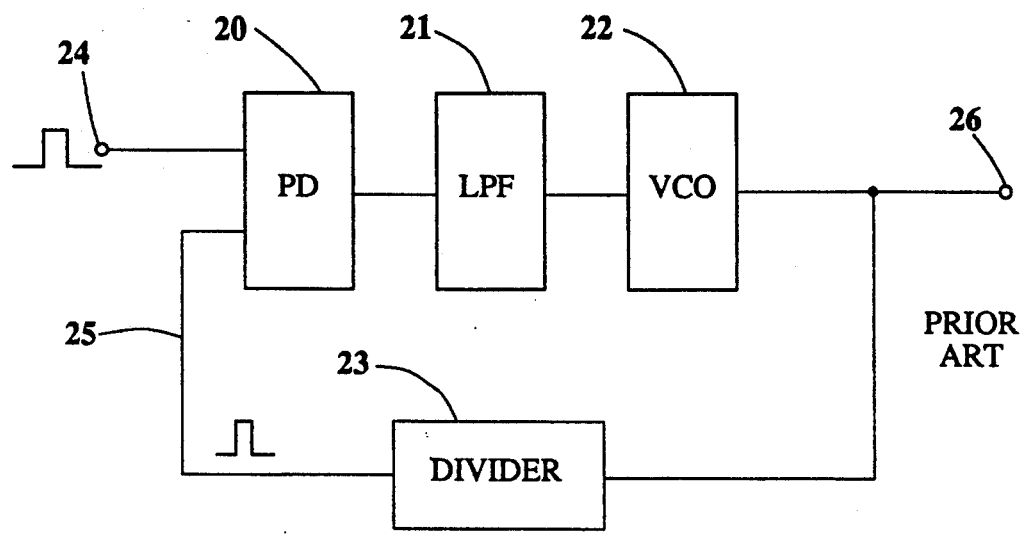
FIG. 1 is a block diagram of a conventional PLL circuit utilized to generate a sampling clock signal.
Figure 2:
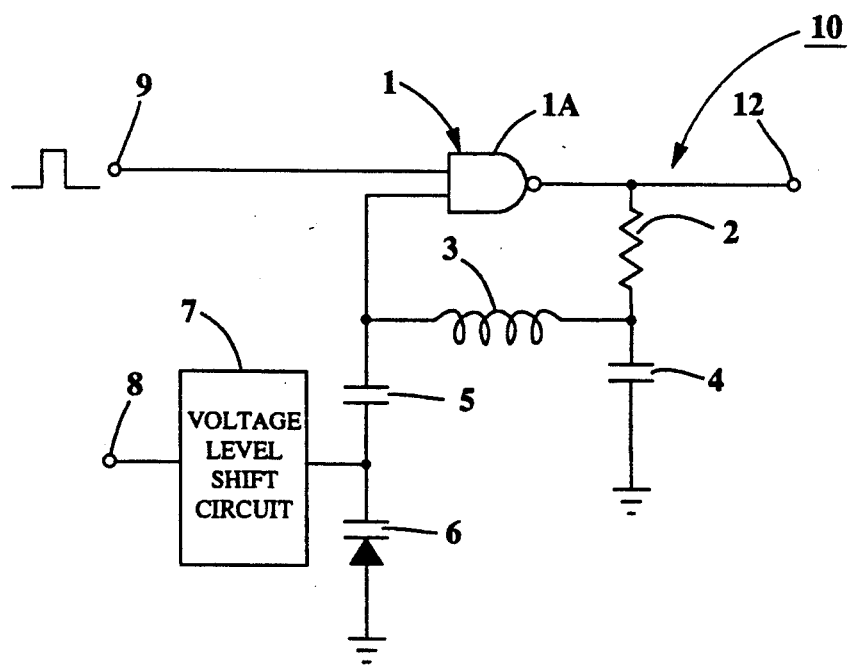
FIG. 2 is a circuit diagram illustrating a first embodiment of a VCO comprising this invention.

Reference is now made to FIG. 2 disclosing a first embodiment of VCO 10 comprising this invention. VCO 10 comprises circuit 1 with one input 9 connected to receive a horizontal sync signal and with its output 12 also connected to one terminal of resistor 2. The other terminal of resistor 2 is connected to one terminal of coil 3 and capacitor 4. The other terminal of coil 3 is connected to the other input of circuit 1, in this embodiment comprising NAND circuit 1A, and to one terminal of capacitor 5. The other terminal of capacitor 5 is connected both to one terminal of variable capacitance diode (VCD) 6 and the output of voltage level shift circuit 7. The other terminals of VCD 6 and capacitor 4 are connected to a reference potential, e.g., ground.

Voltage shift circuit 7 is a voltage level shifter which provides as an output a higher voltage level compared to its lower input voltage and the voltage output varies linearly with changes in the lower voltage input. Thus, for example, if control voltage 8 is variable between 0 V to 5 V, e.g., which is the source voltage, VDD, in an integrated circuit configuration, and VCD 6 linearly operates within the range of 0 V to 15 V, then, voltage shift circuit 7 shifts input control voltage from 0 V to 15 V.

It should be noted that the voltage level shift circuit 7 may be omitted, depending upon the characteristics of VCD 6. If circuit 7 is omitted, control voltage 8 may be applied directly to the node between capacitor 5 and VCD 6. For example, variable capacitance diodes are now available that linearly vary in capacitance relative to an applied voltage within the range of 0 V to 5 V so that circuit 7 is not necessary for shifting the input voltage level to meet the requirements of a higher operating voltage.

A control voltage 8 is applied to voltage level shift circuit 7 while a horizontal sync signal, which is active at low state, is applied at input 9 to the gate input of NAND 1A. A synchronized oscillation frequency or sampling clock signal is obtained from NAND 1A at output 12.

In VCO 10, when horizontal sync signal at input 9 is at a low state, output 12 of NAND circuit 1 is at a high state and, as a result oscillation will terminate. Thus, the output of NAND circuit 1A is in a stable state. When horizontal sync signal at input 9 is at a high state, the output signal 10 at output 12 has an oscillation frequency corresponding to the applied control voltage 8.

Figure 3:
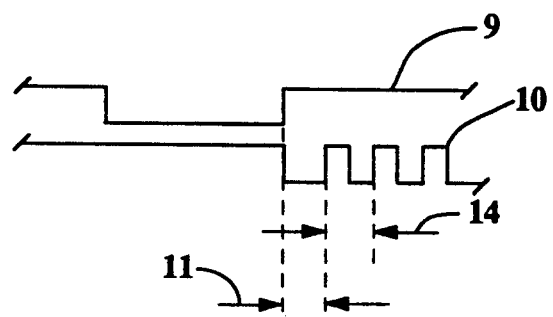
FIG. 3 is a time chart illustrating the operation of the VCO in FIG. 1 at the initiation of oscillation.

FIG. 3 shows a timing chart illustrating exemplary waveforms of horizontal sync signal at input 9 and sampling clock signal 10 having an oscillation period 14 at output 12 at the point in time when VCO 10 initiates oscillation. When horizontal sync signal 9 is at a low state, the clock signal at output 10 from NAND circuit 1A is at a high stable state. When horizontal sync signal 9 is switched to a high state and the oscillation standby time 11 has elapsed, oscillation at output 12 will commence. The duration of the oscillation standby time 11 is fixed according to the capacitance, C, of VCD, the inductance, L, of coil 3 and the resistance, R, of resistor 2. It has been determined that, since oscillation standby time 11 has no variation and is a very stable time period, the oscillation signal at output 12 can be satisfactorily employed as a sampling clock signal regardless of variations in phase of the video signal. By varying control voltage 8, the output of voltage level shift circuit 7 is changed which, in turn, causes a change in the capacitance of VCD 6 thereby enabling an immediate change in the oscillation period 14. Thus, the frequency of sampling clock 10 at output 12 of NAND 1A is controlled by the voltage applied to VCD 6. The forgoing may be explained as follows.

The frequency of the sampling clock signal 10 at output 12 may be expressed as follows:

$$f_{out} = \frac{1}{2\pi \sqrt{LC}}$$

where $C = \frac{C_4 \times C_5 \times C_6}{C_4 + C_5 + C_6}$ and L is the inductance of coil 3 and $C_4$, $C_5$ and $C_6$ are, respectively, the capacitances of capacitor 4, capacitor 5 and VCD 6. Thus, the period 14 of sampling clock 10 may be set at any desired value depending upon control voltage 8 applied to VCD 6.

Figure 4:
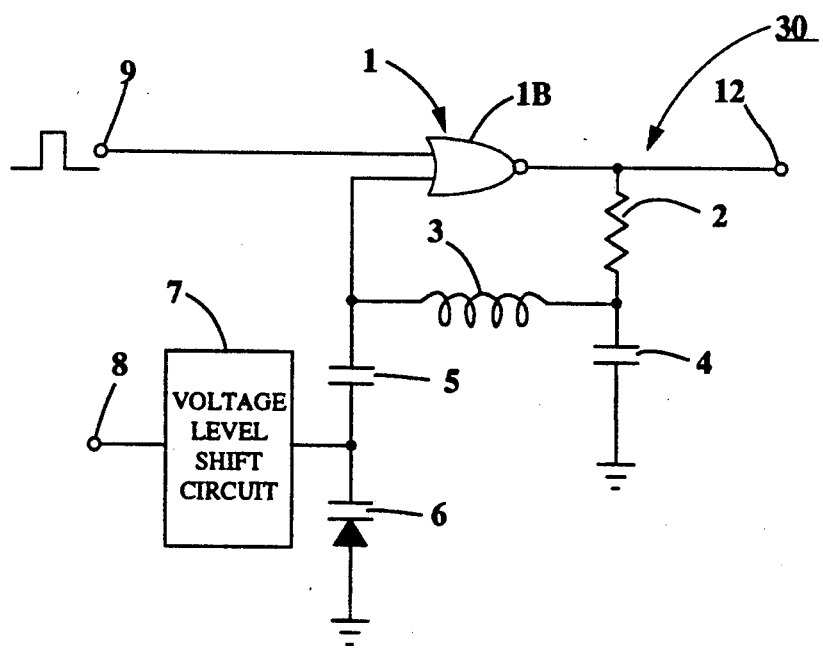
FIG. 4 is a circuit diagram illustrating a second embodiment of a VCO comprising this invention.

Reference is now made to FIG. 4 disclosing a second embodiment of VCO 30 comprising this invention. VCO 30 is identical to VCO 10 in FIG. 2 except oscillation output circuit 1 comprises NOR circuit 1B and, therefore, all corresponding elements of circuit 30 carry the same numeral identification and description thereof relative to circuit 10 in FIG. 2 and the description relative to FIG. 2 is, therefore, equally applicable to FIG. 4. VCO 30, therefore, functions in same manner as VCO 10.

VCD 6 may be comprised of a standard variable capacitance diode as known in the art or an equivalent thereof such as, for example, the semiconductor devices of the type disclosed in U.S. Pat. No. 4,630,082 or other such voltage controlled capacitance devices.

An example of one application of this invention, VCO 10 or 30 may be employed as a VCO for a PLL circuit to reduce the active pulse width of the horizontal sync signal and provide it as a horizontal sync signal for a NAND or NOR circuit 1A or 1B. By doing so, the jitter that has been heretofore generated in conventional PLL circuits can be eliminated during the time when the horizontal sync signal rises from a low state to a high state so that a sampling clock signal is obtained that has in phase stability. In other words, since the basic input signal in the form of the horizontal sync signal fluctuates, the circuit of this invention provides a stable output sampling clock signal 10 from the PLL circuit whose frequency remains stable in spite of instability or jitter present in the syn signal.

While the invention has been described in conjuction with several specific embodiments, it is evident to those skilled in the art that many further alternatives, modifications and variations will be apparent in light of the forgoing description. Thus, the invention described herein is intended to embrace at such alternatives, modifications, applications and variations as fall within the spirit and scope of the appended claims.

What is claimed is:

1. A voltage controlled oscillator operating synchronously with an external sync signal to produce a stable oscillation frequency output of desired frequency comprising:

a NAND or a NOR circuit having two inputs with one input of said NAND or NOR circuit connected to receive said external sync signal and having an output for said oscillation frequency, a resistor having one terminal connected to said output, a first capacitor having one terminal connected to the other terminal of said resistor and its other terminal connected to ground, a coil having one terminal connected between said resistor and said first capacitor and its other terminal connected to the other input of said NAND or NOR circuit, a second capacitor having one terminal connected between said NAND or NOR circuit other input and said coil other terminal, a variable capacitance diode means having its anode terminal connected to the other terminal of said second capacitor and its cathode terminal connected directly to ground, and input means connected between said second capacitor and said variable capacitance means to both establish a reverse bias on said variable capacitance diode means and vary the voltage applied to said variable capacitance means.

2. The voltage controlled oscillator circuit of claim 1 wherein said input means comprises a voltage level shift circuit.

3. The voltage controlled oscillator circuit of claim 1 wherein said variable capacitance diode means is a variable capacitance diode.

* * * * *